United States Patent
Tu et al.

(10) Patent No.: US 12,439,568 B2
(45) Date of Patent: Oct. 7, 2025

(54) IMMERSION LIQUID COOLING EQUIPMENT AND HEAT DISSIPATION METHOD FOR ELECTRONIC DEVICE

(71) Applicant: Wiwynn Corporation, New Taipei (TW)

(72) Inventors: Tai-Ying Tu, New Taipei (TW); Chia-Yi Wu, New Taipei (TW); Tsung-Han Li, New Taipei (TW); Ting-Yu Pai, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 316 days.

(21) Appl. No.: 18/447,275

(22) Filed: Aug. 9, 2023

(65) Prior Publication Data
US 2024/0057291 A1 Feb. 15, 2024

Related U.S. Application Data

(60) Provisional application No. 63/397,329, filed on Aug. 11, 2022.

(30) Foreign Application Priority Data

Mar. 6, 2023 (TW) ................... 112107966

(51) Int. Cl.
*H05K 7/20* (2006.01)

(52) U.S. Cl.
CPC ..... *H05K 7/20836* (2013.01); *H05K 7/20254* (2013.01); *H05K 7/203* (2013.01); *H05K 7/20318* (2013.01); *H05K 7/20327* (2013.01)

(58) Field of Classification Search
CPC ........... H05K 7/20836; H05K 7/20254; H05K 7/203; H05K 7/20318; H05K 7/20327
(Continued)

(56) References Cited

U.S. PATENT DOCUMENTS

| | | | |
|---|---|---|---|
| 7,916,483 B2 * | 3/2011 | Campbell | H05K 7/20772 165/80.4 |
| 8,203,842 B2 * | 6/2012 | Campbell | H05K 7/20772 165/80.4 |

(Continued)

FOREIGN PATENT DOCUMENTS

| | | |
|---|---|---|
| CN | 104915321 | 9/2015 |
| CN | 114007381 | 2/2022 |

(Continued)

OTHER PUBLICATIONS

"Office Action of Taiwan Counterpart Application", issued on Jan. 2, 2024, p. 1-p. 9.

(Continued)

*Primary Examiner* — Jon T. Schermerhorn, Jr.
(74) *Attorney, Agent, or Firm* — JCIPRNET (57) ABSTRACT

A piece of immersion liquid cooling equipment, which is adapted for an electronic device, includes a tank, a condenser, a cold plate, and a first pipe. The tank accommodates a first fluid, and the electronic device is immersed in the first fluid in the form of a liquid. The condenser is disposed in the tank and located above the first fluid in the form of a liquid. The cold plate is disposed in the tank and is in thermal contact with at least one high power commodity of the electronic device. The first pipe is disposed and extends between an exterior and an interior of the tank. The first pipe communicates with the condenser and the cold plate. The first pipe is configured to receive a second fluid to flow through the condenser and the cold plate. A heat dissipation method for an electronic device.

21 Claims, 9 Drawing Sheets

(58) Field of Classification Search
USPC .......................................................... 165/287
See application file for complete search history.

(56) References Cited

U.S. PATENT DOCUMENTS

| | | | |
|---|---|---|---|
| 9,844,166 B2* | 12/2017 | Shelnutt | F28F 27/02 |
| 11,903,166 B2* | 2/2024 | Peterson | H05K 7/20818 |
| 12,041,751 B2* | 7/2024 | Jian | H05K 7/20318 |
| 12,144,148 B2* | 11/2024 | Oruganti | H05K 7/20818 |
| 12,289,861 B2* | 4/2025 | Malouin | H05K 7/20254 |
| 2005/0207116 A1* | 9/2005 | Yatskov | H05K 7/2079 |
| | | | 165/80.3 |
| 2006/0278372 A1* | 12/2006 | Lai | H01L 23/467 |
| | | | 165/80.4 |
| 2023/0240051 A1* | 7/2023 | Gao | H05K 7/20818 |
| | | | 361/688 |
| 2024/0237300 A9* | 7/2024 | Shelnutt | G06F 1/20 |
| 2025/0176138 A1* | 5/2025 | Alissa | H05K 7/20781 |

FOREIGN PATENT DOCUMENTS

| | | | | |
|---|---|---|---|---|
| CN | 114340332 | | 4/2022 | |
| CN | 117641821 A | * | 3/2024 | ......... H05K 7/20318 |
| CN | 117858478 A | * | 4/2024 | ......... H05K 7/20381 |
| CN | 119603933 A | * | 3/2025 | ......... H05K 7/20781 |
| JP | 7662816 B2 | * | 4/2025 | ............. H05K 7/205 |
| TW | M610267 | | 4/2021 | |
| WO | WO-2024091967 A1 | * | 5/2024 | ............... G06F 1/20 |

OTHER PUBLICATIONS

"Office Action of Taiwan Counterpart Application", issued on Dec. 12, 2024, p. 1-p. 9.

* cited by examiner

IMMERSION LIQUID COOLING EQUIPMENT AND HEAT DISSIPATION METHOD FOR ELECTRONIC DEVICE

CROSS-REFERENCE TO RELATED APPLICATION

This application claims the priority benefit of U.S. Provisional application Ser. No. 63/397,329, filed on Aug. 11, 2022 and Taiwan application serial no. 112107966, filed on Mar. 6, 2023. The entirety of the above-mentioned patent application is hereby incorporated by reference herein and made a part of this specification.

BACKGROUND

Technical Field

The disclosure relates to a piece of immersion liquid cooling equipment and a heat dissipation method for an electronic device.

Description of Related Art

With the rapid development of technology, especially in the era when the demand for network, artificial intelligence, and cloud services has greatly increased, the data center or server system needs to process an increasing amount of data. In order to maintain or improve the processing efficiency of the data center, dissipating heat from the data center continuously and effectively is essential. However, due to the high power density of the data center, the heat generated is excessively large, and the conventional heat dissipation methods need to respond by increasing power or scale. However, such an approach is very energy-intensive, which greatly increases the cost and the impact on the environment.

Therefore, in recent years, water cooling technologies such as immersion cooling have gradually received attention. Specifically, the immersion cooling equipment is to immerse the heat source of the data center, such as the motherboard and the electronic elements thereon, in a non-conductive cooling liquid. Since the electronic elements and the cooling liquid may be fully in contact with each other, the immersion cooling may achieve higher heat dissipation efficiency than the conventional air cooling. Moreover, the immersion cooling does not need to install a fan, which helps to reduce the energy consumption, cost, operating noise, and space requirements of the immersion cooling equipment. Under these advantages, immersion cooling technology gradually replaces air cooling.

However, neither of the above-mentioned methods has the capability to cope with all conditions of the environment, that is to say, both the environment of the data center or server system and the working state of the data center or server system itself are changing, but the existing cooling means can merely cope with one of the environments and the states, and cannot change with the requirements. Accordingly, how to improve the existing cooling means to meet different requirements or conditions has become a problem to be considered and solved by those skilled in the art.

SUMMARY

An immersion liquid cooling equipment of the disclosure, which is adapted for an electronic device, includes a tank, a condenser, a cold plate, and a first pipe. The tank is configured to accommodate a first fluid, and the electronic device is disposed in the tank and configured to be immersed in the first fluid in the form of a liquid. The condenser is disposed in the tank and disposed above the first fluid in the form of a liquid. The cold plate is disposed in the tank and in thermal contact with at least one high power commodity of the electronic device. The first pipe is disposed and extends between an exterior and an interior of the tank. The first pipe communicates with the condenser and the cold plate. The first pipe is configured to receive a second fluid to flow through the condenser and the cold plate.

A heat dissipation method for an electronic device of the disclosure includes: a tank is provided to accommodate a first fluid, and the electronic device is immersed in the first fluid in the form of a liquid; a cold plate is provided to be in thermal contact with at least one high power commodity of the electronic device; and a condenser and a first pipe are provided, the first pipe communicates with the condenser and the cold plate, and a second fluid is provided to the first pipe to flow through the condenser and the cold plate. The condenser is located above the first fluid in the form of a liquid. The first fluid in the form of a liquid absorbs the heat of the electronic device and is converted into the first fluid in the form of a gas, and the second fluid flowing through the condenser drives the condenser to absorb the heat of the first fluid in the form of a gas and convert the first fluid in the form of a gas into the first fluid in the form of a liquid, and flows back into the tank. The second fluid flowing through the cold plate drives the cold plate to absorb the heat of the high power commodity.

DESCRIPTION OF THE EMBODIMENTS

Figure 1:
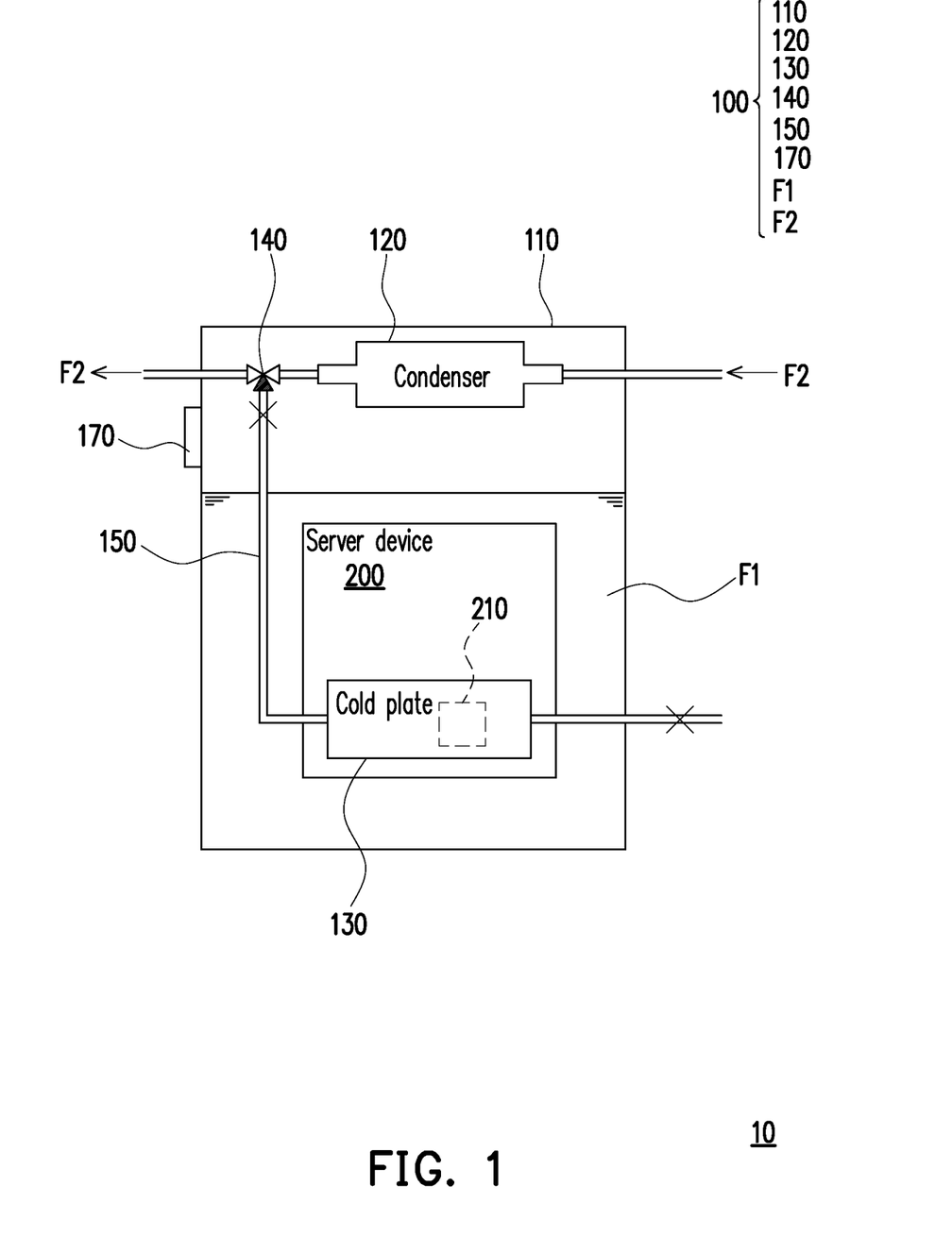
FIG. 1 is a simplified schematic diagram of a server system according to an embodiment of the disclosure.
Figure 2:
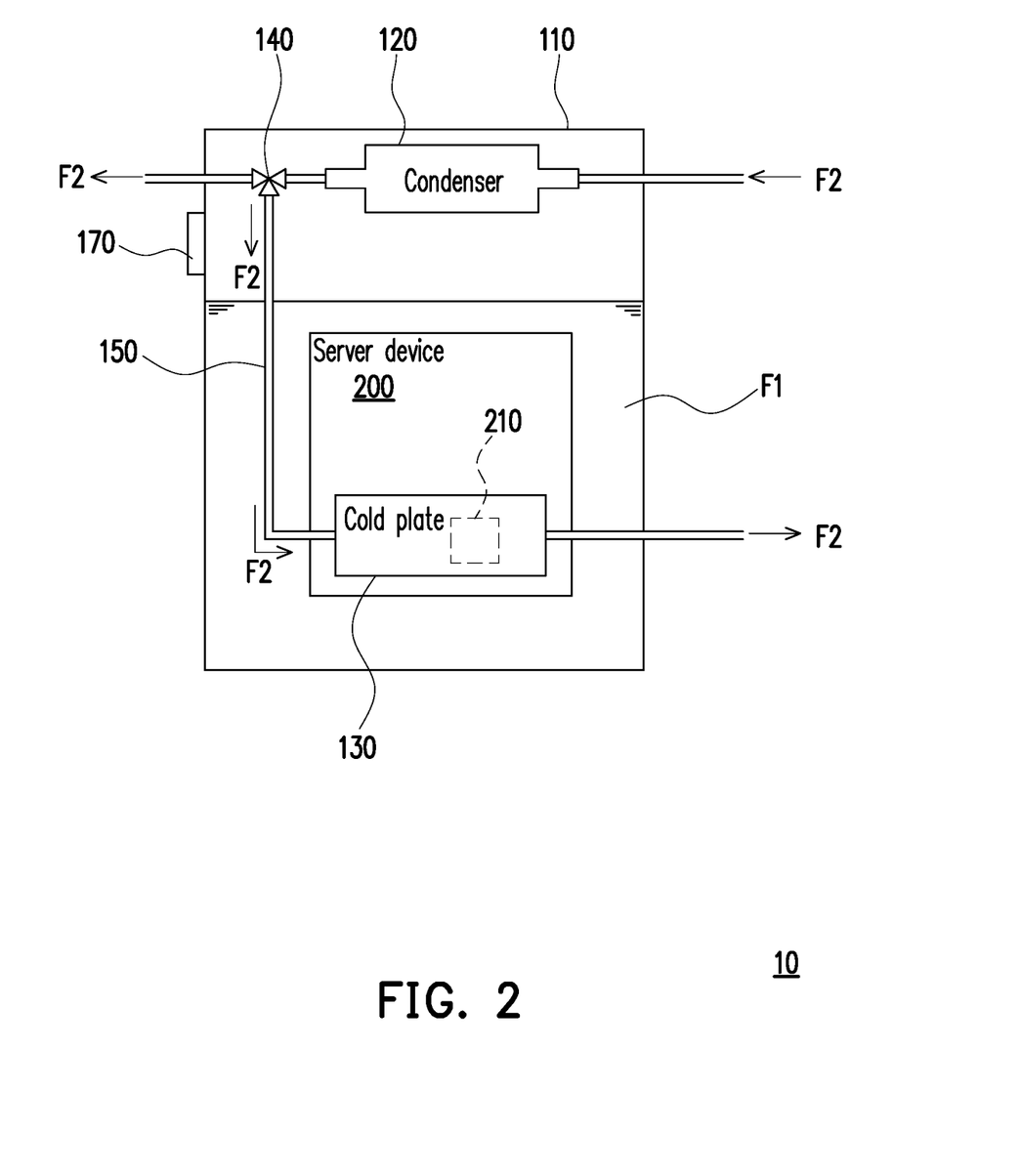
FIGS. 2 and 3 each are schematic diagrams of the server system in FIG. 1 in different states.
Figure 3:
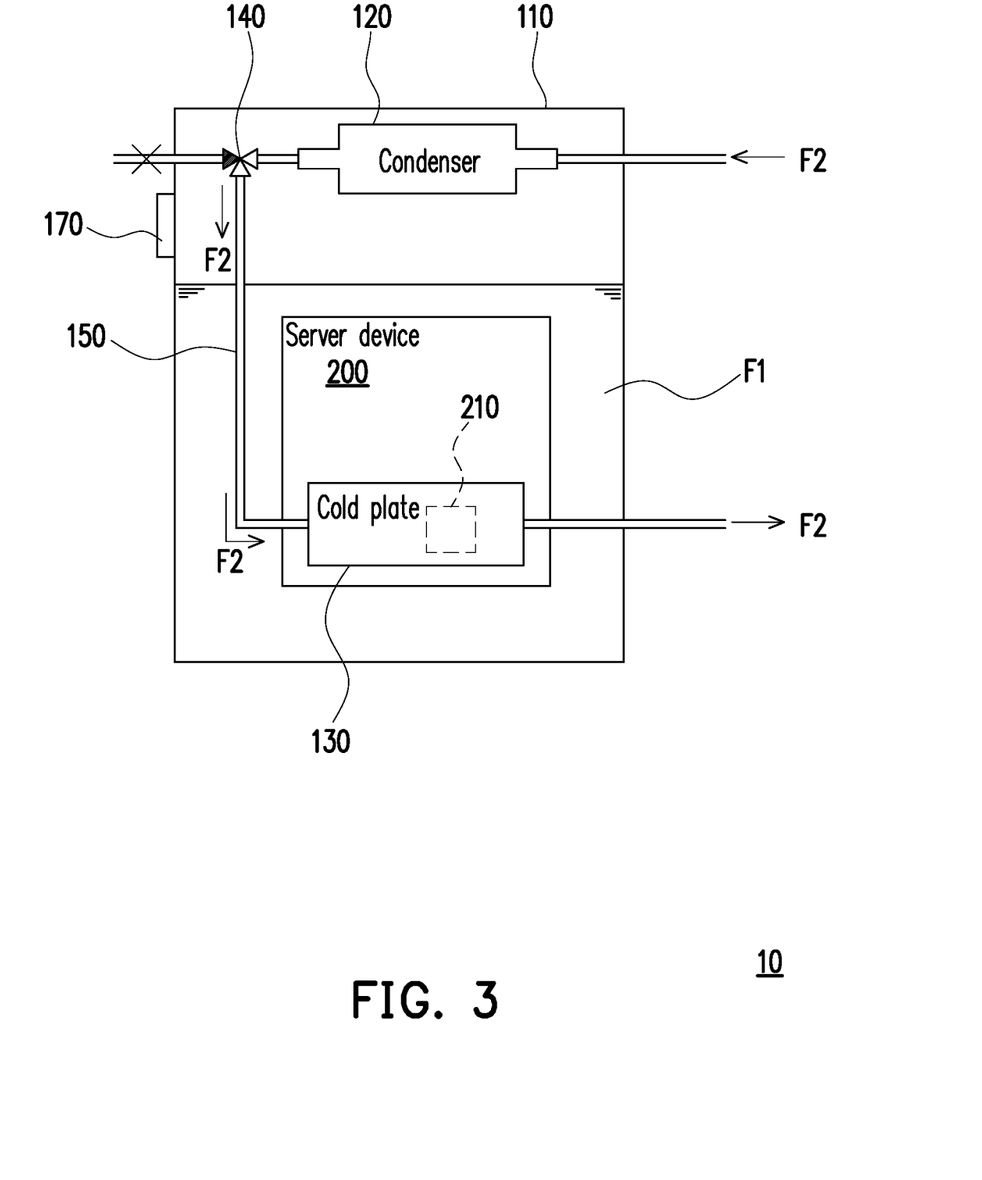

FIG. 1 is a simplified schematic diagram of a server system according to an embodiment of the disclosure. FIGS. 2 and 3 each are schematic diagrams of the server system in FIG. 1 in different states. Please refer to FIGS. 1 to 3 at the same time. In the embodiment, a server system is, for example, an Edge Immersion Cooling system (or an Immersion Cooling system for Edge server), which includes a server device 200 and immersion liquid cooling equipment 100. The immersion liquid cooling equipment 100 includes a tank 110, a condenser 120, a cold plate 130, a multi-way valve 140, a first pipe 150, a first fluid F1, and a second fluid F2. The tank 110 is configured to accommodate the first fluid F1, and the server device 200 is disposed in the tank 110 and immersed in the first fluid F1 in the form of a liquid. The condenser 120 is disposed in the tank 110 and located above the first fluid F1 in the form of liquid, that is, the condenser 120 is not immersed in the first fluid F1 in the form of a liquid. The cold plate 130 is disposed in the tank 110 and is in thermal contact with at least one high power commodity 210 of the server device 200. Here, the high power commodity 210 is, for example, a high heat generating element such as a central processing unit (CPU) or a display chip (e.g., Graphics Processing Unit, GPU) of the server device 200, and the server device 200 is, for example, a mainboard of server that the high power commodity 210 is disposed thereon. The first pipe 150 is disposed and extends between an exterior and an interior of the tank 110, and the first pipe 150 communicates with the condenser 120 and the cold plate 130. The first pipe 150 is configured to receive the second fluid F2, and make the second fluid F2 be able to flow through the condenser 120 and the cold plate 130.

In the embodiment, the first fluid F1 is, for example, a non-conductive and low-boiling two-phase cooling liquid. The first fluid F1 in the form of a liquid absorbs the heat of the server device 200 and is converted into the first fluid F1 in the form of a gas. The second fluid F2 flowing through the condenser 120 drives the condenser 120 to absorb the heat of the first fluid F1 in the form of a gas, and convert the first fluid F1 in the form of a gas into the first fluid F1 in the form of a liquid, and then flows back into the tank 110. Moreover, in an embodiment, the cold plate 130 is in contact with the high power commodity 210 with a solid structure or through a heat conduction interface so that the second fluid F2 flowing through the cold plate 130 drives the cold plate 130 to absorb the heat of the high power commodity 210 to directly dissipate heat from the high power commodity 210.

In addition, the multi-way valve 140 is disposed at the first pipe 150 and located between the condenser 120 and the cold plate 130, and the second fluid F2 flowing out of the condenser 120 is controlled by the multi-way valve 140 to have different flow directions. In the embodiment, the multi-way valve 140 is a solenoid valve, which is electrically connected to and controlled by a controller 170 (such as a programmable universal controller, RWG). The controller 170 is configured to receive a monitoring signal from the server device 200, and the monitoring signal is configured to reflect the heating state of the high power commodity 210, such as the wattage or temperature of the high power commodity 210, to allow the controller 170 to control the operation of the multi-way valve 140 according to the monitoring signal. As shown in FIG. 1, when the high power commodity 210 does not reach a first preset value, the controller 170 drives the multi-way valve 140 so that the second fluid F2 flowing out of the condenser 120 all flows out of the tank 110 but does not flow through the cold plate 130. As shown in FIG. 2, when the high power commodity 210 reaches the first preset value but does not reach a second preset value, the controller 170 drives the multi-way valve 140 so that the second fluids F2 flowing out of the condenser 120 each flows out of the tank 110, and flows to the cold plate 130. As shown in FIG. 3, when the high power commodity 210 reaches the second preset value, the controller 170 drives the multi-way valve 140 so that the second fluid F2 flowing out of the condenser 120 all flows to the cold plate 130. Here, the second preset value is higher than the first preset value, and the wattage or temperature of the high power commodity 210 may displayed.

Based on the above configuration of components and the aforementioned different states of FIGS. 1 to 3, the server system 10 of the embodiment not only can continuously use the second fluid F2 flowing out of the condenser 120 for heat dissipation of the high power commodity 210, but also can provide different degrees of heat dissipation effects according to the different working states of the server device 200 (and the high power commodity 210 thereof). Referring to FIG. 2, through experimentation, if the second fluid F2 with a flow rate of 80 liter per minute (LPM) at 30° C. is provided in the first pipe 150, which is made to flow through the condenser 120 first to allow the second fluid F2 flowing through the condenser 120 to be able to absorb the heat of the first fluid F1 in the form of a gas around the condenser 120 and convert the first fluid F1 in the form of a gas into the first fluid F1 in the form of a liquid to flow back to the tank 110 as the heat dissipation in the first step. At this time, the temperature of the second fluid F2 flowing out of the condenser 120 is about 36° C. In light of the above, compared with the operating temperature of the high power commodity 210 in operation, the second fluid F2 at this time still has heat absorption capacity because the second fluid F2 (e.g., 36° C.) that flows in to the cold plate 130 is lower than the case temperature (e.g., 60° C.) of the high power commodity 210 in operation. Therefore, a part of the second fluid F2 (for example, 51 LPM) is guided to the cold plate 130 through the multi-way valve 140 to directly dissipate heat from the high power commodity 210, and is discharged out of the tank 110 after absorbing heat. At this time, the measured temperature of the second fluid F2 discharged from the tank 110 is about 46° C. Heat absorption capacity of a cold plate can be defined as a temperature difference divided by a thermal resistance of the cold plate, wherein the temperature difference can be characterized as the variance in temperature between the cold plate (close to the case temperature of the high-power commodity in operation) and the liquid entering the cold plate at its inlet. In this embodiment, the thermal resistance of the cold plate 130 is about 0.024 (K/W), therefore the heat absorption capacity of each cold plate 130 is about 1 KW ((60−36)(° C.)/0.024 (K/W)=1 KW). As a result, comparing FIG. 1 and FIG. 2, the heat dissipation capacity of the immersion liquid cooling equipment 100 can be effectively increased by about 1 KW by means of the staged heat dissipation of the second fluid F2 in FIG. 2. In some applications, such as edge servers, the size of the condenser should be kept small such that a maximum of the heat absorption capacity of the condenser could be limited. However, in such applications, with the help of the cold plate 130, the heat absorption capacity of the whole system can be further enlarged (e.g., 1 KW per cold plate 130). When a number of the high power commodity 210 per mainboard is increased, the system could be provided with sufficient number of cold plates 130 to effectively dissipate heat from the mainboard. Conversely, because the second fluid F2 provided to the first pipe 150 has a relatively strong heat absorption capacity, the second fluid F2 may be efficiently utilized in the heat dissipation mechanism through an appropriate pipe arrangement according to the difference in the degree of heat generation of the heat source (such as the high power commodity 210 and other heating elements not shown in the figure) in the tank 110.

Accordingly, the temperature of the second fluid F2 needs to be substantially lower than the vaporization temperature (i.e., the boiling point) of the first fluid F1, and the temperature of the second fluid F2 also needs to be substantially lower than the operating temperature of the high power commodity 210, so as to facilitate the heat dissipation of the first fluid F1 in the form of a gas and the high power commodity 210 in sequence. In an embodiment, the second fluid F2 is water conforming to the W4 grade of the American Society of Heating, Refrigerating, and Air-Condition Engineers (ASHRAE), and is at a temperature of 2°

C. to 45° C. In other embodiments, the second fluid F2 may be a fluid mixed with water and a condensing agent or other coolants. In another unillustrated embodiment, the second fluid F2 may also be a fluid mixed with water and ethylene glycol or water and propylene glycol.

Compared with the partial drainage of the second fluid F2 in FIG. 2, since FIG. 3 is the state facing higher temperature (greater calorific value) of the high power commodity 210, the controller 170 may drive the multi-way valve 140 so that the second fluid F2 flowing out of the condenser 120 is all guided to the cold plate 130 for heat dissipation.

It should also be noted that although the embodiment is described with the high power commodity 210 on the server device 200 as an example, in other unillustrated embodiments, the immersion liquid cooling equipment may also perform heat transfer as described above for other electronic devices.

Figure 4:
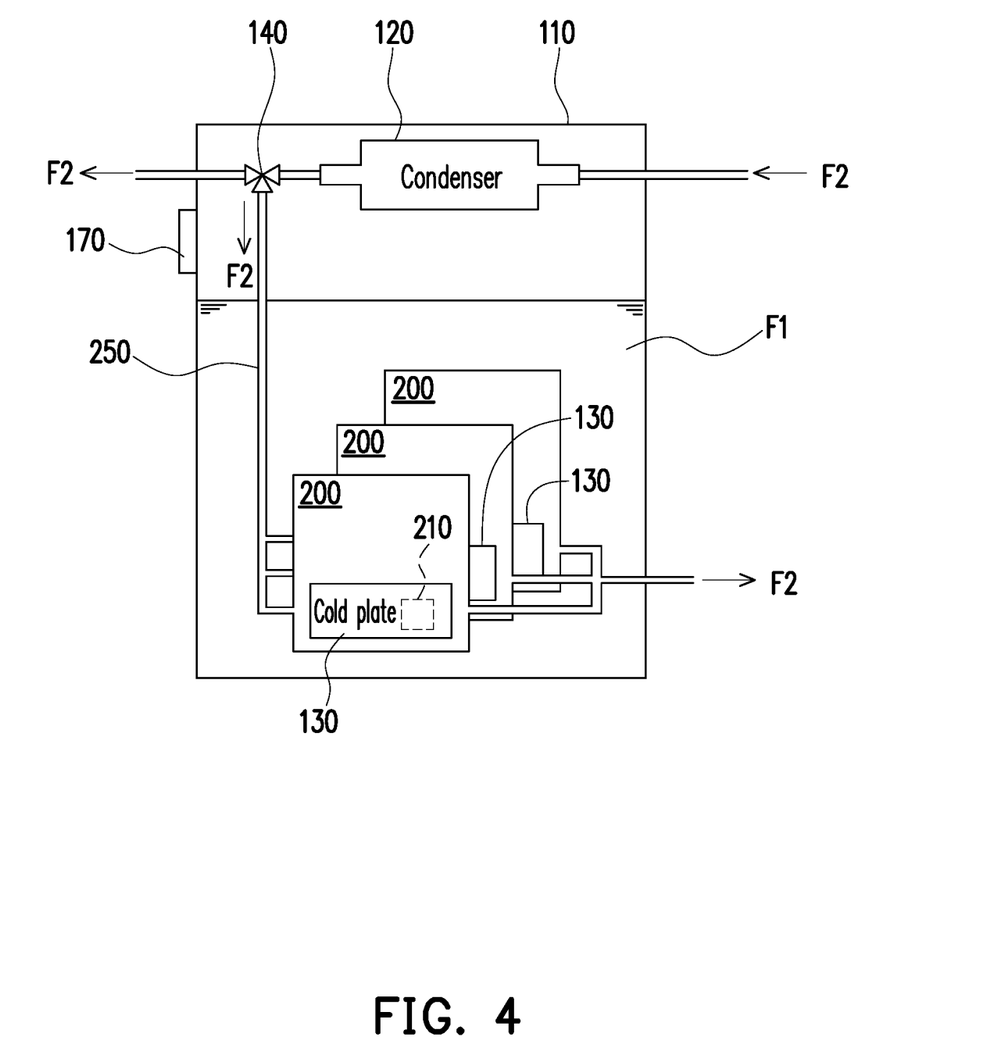
FIGS. 4 and 5 each are simplified schematic diagrams of server systems according to different embodiments of the disclosure.
Figure 5:
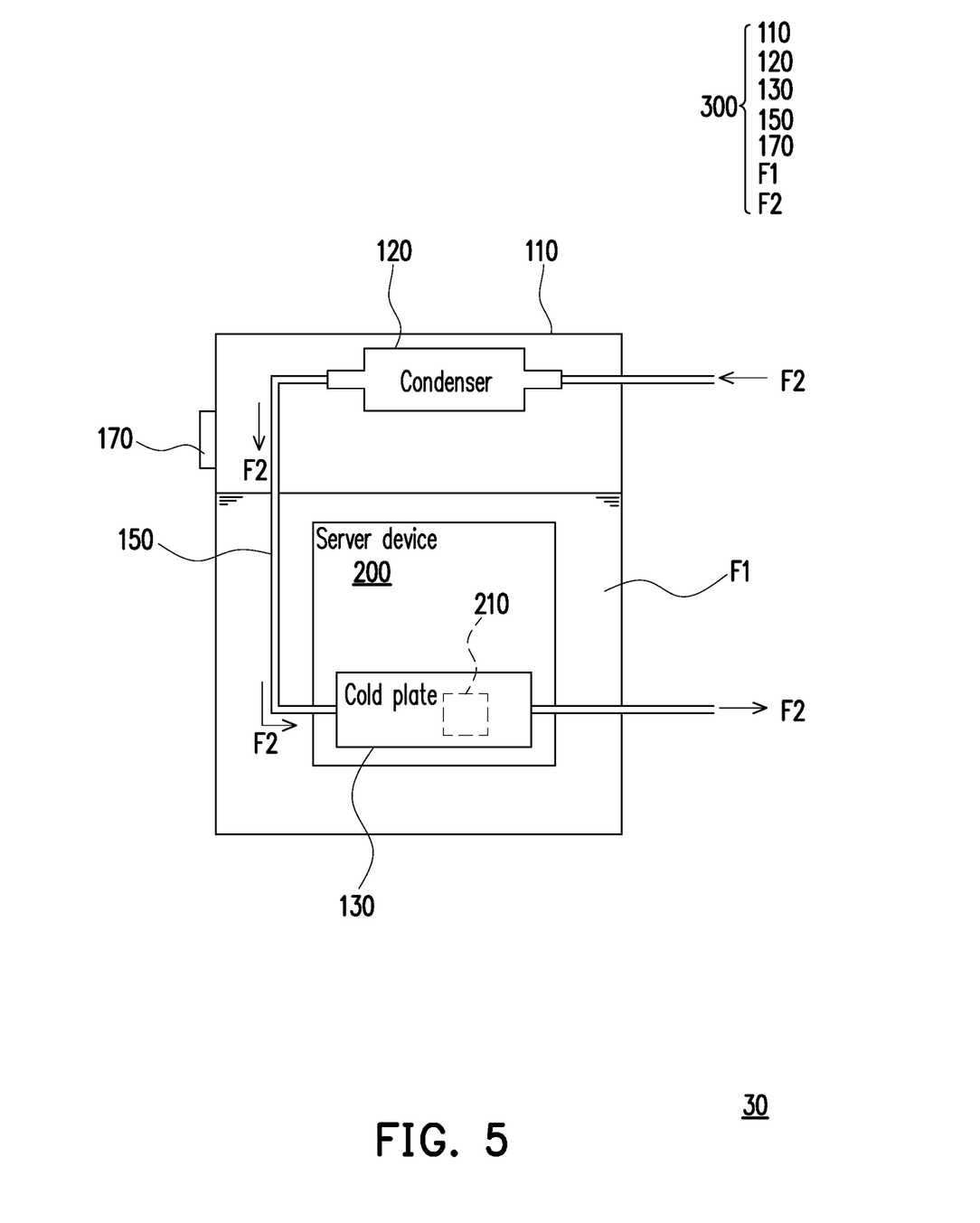

FIGS. 4 and 5 each are simplified schematic diagrams of server systems according to different embodiments of the disclosure. Please refer to FIG. 4 first. The difference between the embodiment and the foregoing embodiment is that multiple server devices 200 (or multiple electronic devices) are immersed in the first fluid F1 in the form of a liquid in the tank 110 of the embodiment. Therefore, it is expected that multiple cold plates 130 are required to correspond to the high power commodities 210 of the server devices 200, so a first pipe 250 in the embodiment is in the form of a manifold structure between the condenser 120 and the cold plates 130, so as to divert and guide the second fluid F2 flowing out of the condenser 120 to the cold plates 130.

Referring to FIG. 5, in a server system 130 and immersion liquid cooling equipment 300 thereof of the embodiment, substantially, the multi-way valve 140 of the foregoing embodiment is not provided, that is, the second fluid F2 flowing out of the condenser 120 is all guided to the cold plate 130 to fully dissipate heat from the high power commodity 210, which has substantially the same effect as the effect shown in FIG. 3.

Figure 6:
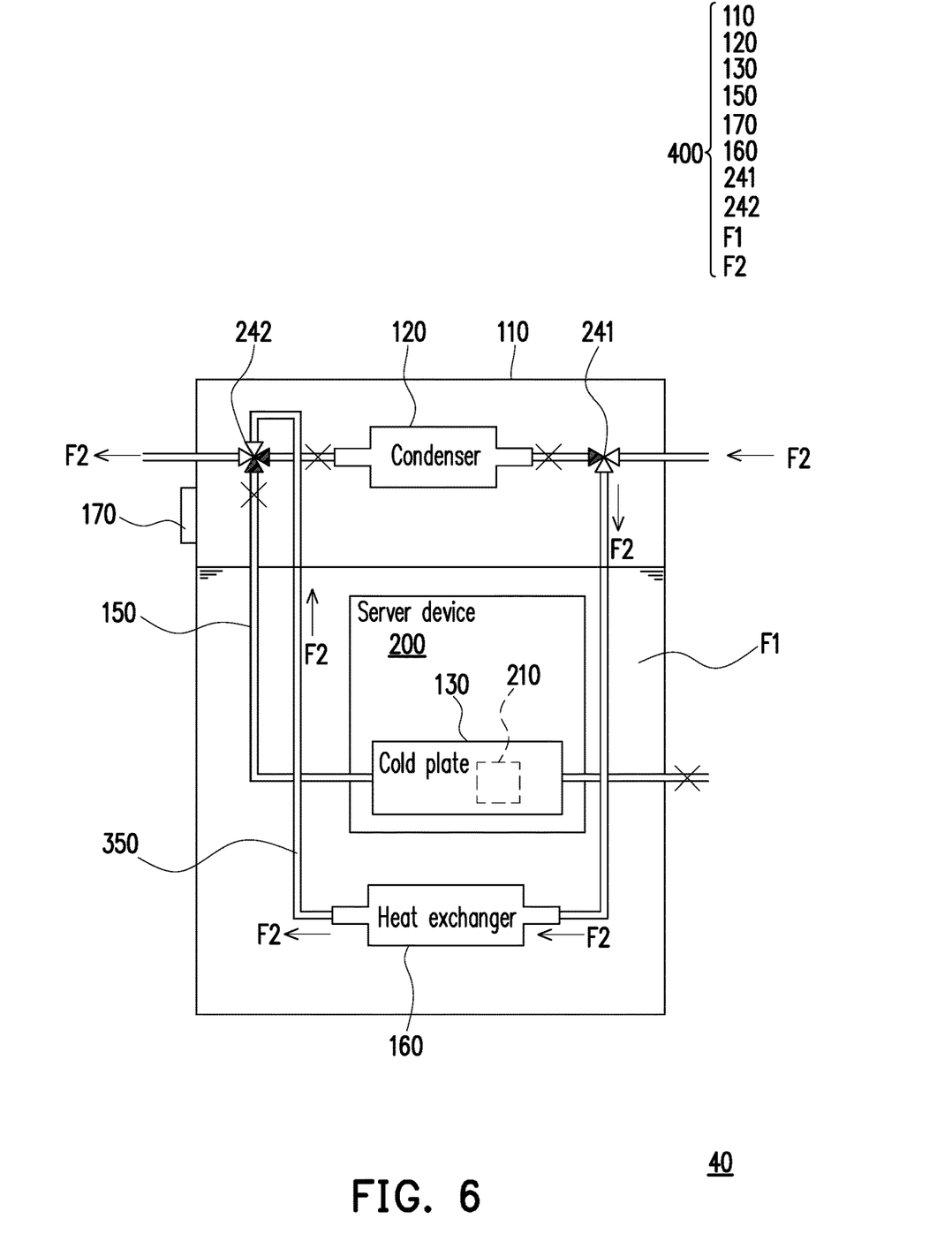
FIG. 6 is a simplified schematic diagram of a server system according to another embodiment of the disclosure.
Figure 7:
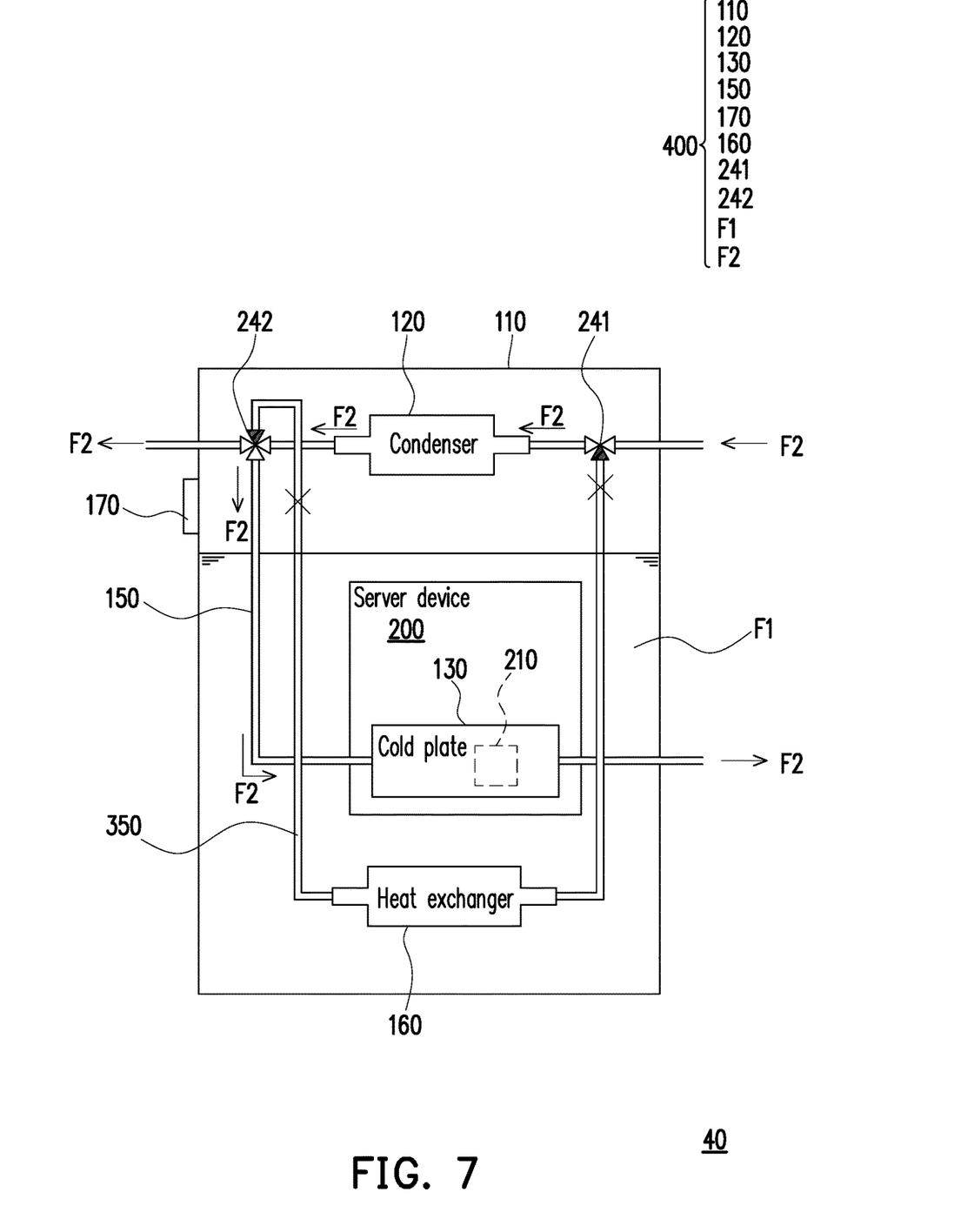
FIG. 7 is a schematic diagram of the server system of FIG. 6 in another state.

FIG. 6 is a simplified schematic diagram of a server system according to another embodiment of the disclosure. FIG. 7 is a schematic diagram of the server system of FIG. 6 in another state. Please refer to FIGS. 6 and 7 at the same time. In a server system 40 and immersion liquid cooling equipment 400 thereof of the embodiment, in addition to the tank 110, the first fluid F1, the first pipe 150, the condenser 120, and the second fluid F2, a heat exchanger 160, a first multi-way valve 241, a second multi-way valve 242, and a second pipe 350 are further included. The second pipe 350 is connected to the first pipe 150 through the first multi-way valve 241 and the second multi-way valve 242, which is equivalent to making the first pipe 150 and the second pipe 350 in a parallel state. The first multi-way valve 241 is arranged between the condenser 120 and the inlet of the first pipe 150, such that the second fluid F2 is guided to the first multi-way valve 241 and the condenser 120 sequentially. The second multi-way valve 242 is arranged to receive the second fluid F2 exiting from the condenser 120, and the heat exchanger 160 is disposed at the second pipe 350 and immersed in the first fluid F1 in liquid.

Based on the above pipe configuration, the second fluid F2 located in the first pipe 150 is driven by the first multi-way valve 241, flows into the condenser 120 or flows through the second pipe 350 and the heat exchanger 160, joins the first pipe 150 through the second multi-way valve 242, and is discharged out of the tank 110. Moreover, the second fluid F2 flowing out of the condenser 120 is driven by the second multi-way valve 242, flows out of the tank 110 or flows into the cold plate 130 or simultaneously flows out of the tank 110 and flows into the cold plate 130.

Further, the first multi-way valve 241 and the second multi-way valve 242 of the embodiment are respectively solenoid valves, which are electrically connected to and controlled by the controller 170 respectively. As mentioned above, the controller 170 is configured to receive the monitoring information from the electronic device (the server device 200) to reflect the heating state of the high power commodity 210. It is worth mentioning that when the server device 200 is not started, such situation could mean that the controller 170 does not receive the monitoring signal, which may be regarded as the initial state of the controller 170, that is, the controller 170 is allowed to drive the first multi-way valve 241 so that the second fluid F2 in the first pipe 150 flows to the second pipe 350 but does not flow to the condenser 120, and the second fluid F2 flows through the heat exchanger 160, joins the first pipe 150 through the second multi-way valve 242 to flow out of the tank 110. Since the second fluid F2 has a stable temperature state as described above, when the ambient temperature of the server device 200 is lower than the temperature of the second fluid F2, the heat of the second fluid F2 is transferred to the first fluid F1 through the heat exchanger 160 to increase the ambient temperature of the server device 200, and further reach the temperature at which the server device 200 can be started smoothly.

For example, when the ambient temperature of the server system 40 is 0° C. to −40° C., the facing primary problem is how to successfully start the server device 200 of the server system 40 in the extremely cold environment shown. Accordingly, providing the second fluid F2 higher than the aforementioned low temperature becomes an effective means of the embodiment. As shown in FIG. 6, when the second fluid F2 continuously transfers heat to the first fluid F1 through the heat exchanger 160, such transfer warms up the server device 200 to overcome the low temperature environment until the temperature of the server device 200 reaches a temperature to be started smoothly.

Next, after the server device 200 is successfully started, the monitoring signal of the server device 200 can be successfully transmitted to the controller 170, and the controller 170 can drive the first multi-way valve 241 and the second multi-way valve 242. The first multi-way valve 241 is driven so that the second fluid F2 flows to the condenser 120 but does not flow to the second pipe 350 and the heat exchanger 160, that is, at this time, the temperature of the second fluid F2 is substantially lower than the server device 200 after starting. Therefore, the second fluid F2 can change from the aforementioned role of heat dissipation (to the first fluid F1) to the role of heat absorption (absorbing the heat at the condenser 120 and the cold plate 130), and dissipates heat from the first fluid F1 in the form of a gas and the high power commodity 210 in the tank 110, as shown in FIG. 7. It should be noted that the second fluid F2 shown in FIG. 7 is guided and diverted by the second multi-way valve 242, a part of the second fluid F2 flows out of the tank 110, and another part of the second fluid F2 is guided to the cold plate 130 and then discharged out of the tank 110. However, it is expected that, like the server system 10 in the foregoing embodiments, the embodiment can also implement the situation shown in FIG. 2 or FIG. 3. In the follow-up, the controller 170 of the embodiment correspondingly adjusts the control means of the second multi-way valve 242 according to the heating state of the high-power commodity 210, which is the same as the control means of the multi-way valve 140 in the foregoing embodiment, and the description is not repeated here.

Figure 8:
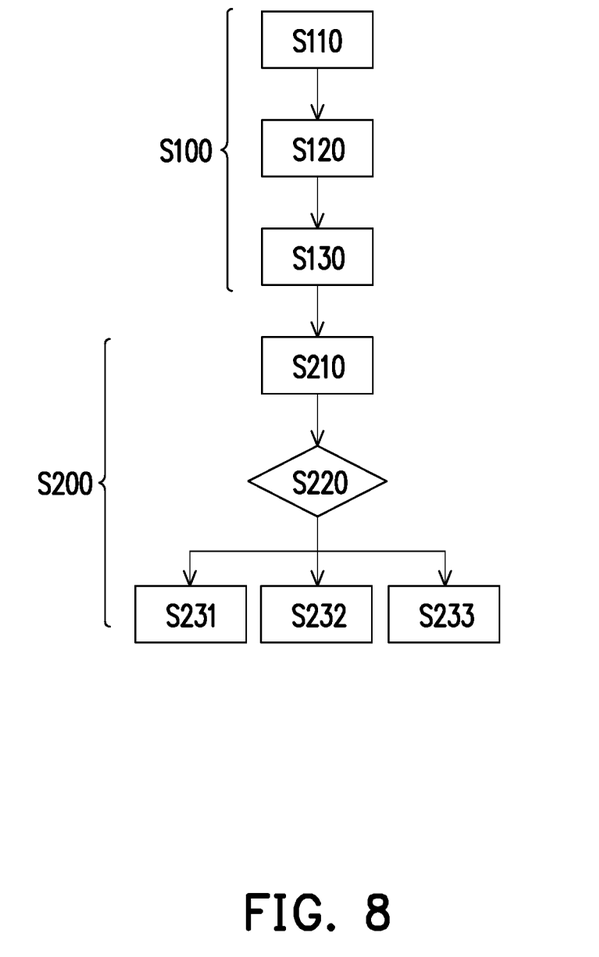
FIG. 8 is a flowchart of a heat dissipation method for an electronic device according to an embodiment of the disclosure.

FIG. 8 is a flowchart of a heat dissipation method for an electronic device according to an embodiment of the disclosure. Referring to FIG. 8, in the embodiment, the flow shown is to describe the deployment means of the immersion liquid cooling equipment and the control means of the immersion liquid cooling equipment corresponding to different requirements, so as to successfully complete the heat dissipation method that can respond to different states of the electronic device. At the same time, component symbols that are the same as the component symbols in the foregoing embodiments are provided here to facilitate component comparison. The heat dissipation method of the electronic device (i.e., the aforementioned server device 200) includes: step S100, the immersion liquid cooling equipment is disposed, which further includes: step S110, the tank 110 is provided to accommodate the first fluid F1, and the electronic device is immersed in the first fluid F1 in the form of a liquid; step S120, the cold plate 130 is provided to be in thermal contact with at least one high power commodity 210 of the electronic device; step S130, the condenser 120 and the first pipe 150 are provided, the first pipe 150 communicates with the condenser 120 and the cold plate 130, the second fluid F2 is provided to the first pipe 150 to flow through the condenser 120 and the cold plate 130, and the condenser 120 is located above the first fluid F1 in the form of a liquid. In this way, step S100 is equivalent to providing the immersion liquid cooling equipment 300 as shown in FIG. 5, which has been able to effectively dissipate heat from the high power commodity 210.

Next, the heat dissipation method of the embodiment further includes: in step S200, the multi-way valve 140 is provided and the flow direction of the second fluid F2 is controlled correspondingly according to the heating state of the high power commodity 210, which further includes: step S210, the multi-way valve 140 is disposed at the first pipe 150 and connected between the condenser 120 and the cold plate 130, so as to control the flow direction of the second fluid F2 flowing out of the condenser 120; step S220, the heating state of the high power commodity 210 is obtained and determined. It should be noted that one of the methods for knowing the heating state of the high power commodity 210 has been described in the above-mentioned embodiments of FIGS. 1 to 7, and the description is not repeated here. In other unillustrated embodiments, a sensing element may be additionally provided to obtain information about the heating state of the high power commodity 210, and then the operation of the multi-way valve 140 is controlled by an operator or a control element.

Figure 9:
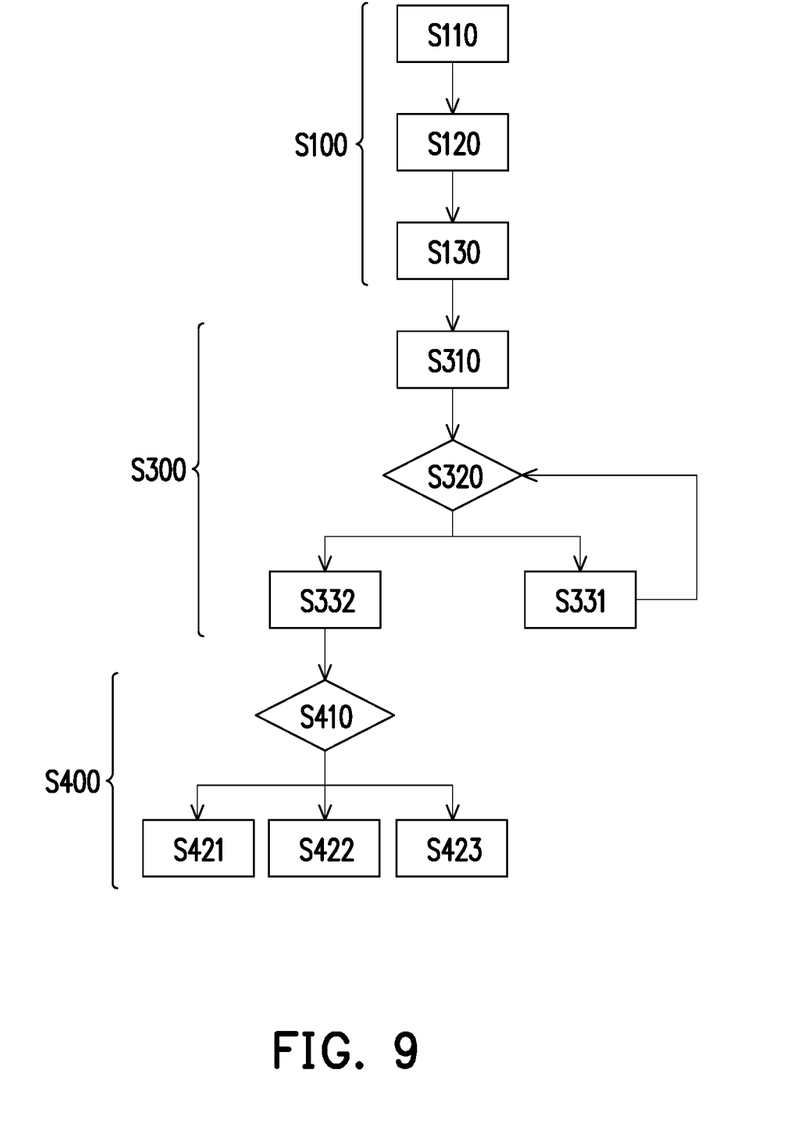
FIG. 9 is a flowchart of a heat dissipation method for an electronic device according to an embodiment of the disclosure.

Next, the multi-way valve 140 is adjusted according to the determination result of step S220 to form the following three states. Step S231, when the heating state of the high power commodity 210 does not reach the first preset value, the multi-way valve 140 is driven so that the second fluid F2 flowing out of the condenser 120 flows out of the tank 110 but does not flow through the cold plate 130; step S232, when the heating state of the high power commodity 210 reaches the first preset value but does not reach the second preset value, the multi-way valve 140 is driven so that the second fluid F2 flowing out of the condenser 120 each flows out of the tank 110 and flows through the cold plate 130; and, step S233, when the heating state of the high power commodity 210 reaches the second preset value, the multi-way valve 140 is driven so that the second fluid F2 flowing out of the condenser 120 all flows to the cold plate 130. So far, step S100 and step S200 are equivalent to providing the immersion liquid cooling equipment 100 as shown in FIGS. 1 to 4, which can also effectively dissipate heat from the high power commodity 210. FIG. 9 is a flowchart of a heat dissipation method for an electronic device according to an embodiment of the disclosure. Referring to FIG. 9, the difference between the embodiment and the foregoing embodiment is that the heat dissipation method of the electronic device in the embodiment is to replace the aforementioned step S200 with step S300, accordingly, the immersion liquid cooling equipment 400 as shown in the aforementioned FIGS. 6 and 7 is built, and only the differences that are different from the flow shown in FIG. 8 are described here. After step S100 is completed, step S300 is continued to be executed, which includes: step S310, the heat exchanger 160, the first multi-way valve 241, the second multi-way valve 242, and the second pipe 350 are provided, the second pipe 350 is connected to the first pipe 150 through the first multi-way valve 241 and the second multi-way valve 242, the first multi-way valve 241 is located before the second fluid F2 enters the condenser 120, the second multi-way valve 242 is located after the second fluid F2 flows out of the condenser 120, and the heat exchanger 160 is disposed at the second pipe 350 and immersed in the first fluid F1 in the form of a liquid; next, step S320 is executed to determine whether the electronic device is started. When the electronic device is not started, step S331 is continued, the first multi-way valve 241 is driven so that the second fluid F2 in the first pipe 150 flows to the second pipe 350 but does not flow to the condenser 120, and the second fluid F2 flows through the heat exchanger 160 and joins the first pipe 150 through the second multi-way valve 242 to flow out of the tank 110. When the electronic device is started, step S332 is continued, the first multi-way valve 241 is driven so that the second fluid F2 flows to the condenser 120 but does not flow to the second pipe 350 and the heat exchanger 160.

Next, after the electronic device is started, step S400 is continued to be executed, which includes step S410, the information about the heating state of the high power commodity 210 is obtained, and step S421, step S422, and step S423, the second multi-way valve 242 is controlled to adopt different corresponding actions based on the obtained information. Here, step S400 is equivalent to step S220 and steps S221 to S223 shown in FIG. 8, and just applies the control method of the multi-way valve 140 in the foregoing embodiment to the second multi-way valve 242, so the description is not repeated here.

To sum up, in the above-mentioned embodiments of the disclosure, the server system and the immersion liquid cooling equipment thereof contain the first fluid through the tank and supply the second fluid to the first pipe, so as to allow the two-phase liquid (the first fluid) with the low boiling point to act as the main heat dissipation mechanism for the server device (or electronic device). At the same time, the second fluid flows through the condenser and the cold plate on the server device (or electronic device), which allows the second fluid to be able to not only effectively drive the condenser to dissipate heat from the first fluid in the form of a gas, but also be further guided to flow to the cold plate, so as to directly dissipate heat from the high power commodity of the server device (or electronic device).

In other words, because the second fluid has a relatively strong heat absorption capacity, the second fluid can achieve the effect of heat absorption in stages through the pipe matching of the fluid system. In terms of overall heat dissipation capacity, the immersion liquid cooling equipment can thus increase heat dissipation capacity thereof.

In one of the embodiments, the second pipe and the heat exchanger may further be additionally disposed in the tank and matched with the multi-way valve, so the effect of low temperature startup when the server system is in a low-temperature environment may be achieved in advance through the second fluid. After the server device (or electronic device) is started, the second fluid further acts as the heat dissipation mechanism of the server device (or electronic device), so as to allow the immersion liquid cooling equipment and the server system using the same to be able to have the capability to adapt to different environmental requirements.

What is claimed is:

1. An immersion liquid cooling equipment, adapted for an electronic device, the immersion liquid cooling equipment comprising:
    a tank, configured to accommodate a first fluid, the electronic device being disposed in the tank and configured to be immersed in the first fluid in the form of a liquid;
    a condenser, disposed in the tank and disposed above the first fluid in the form of a liquid;
    a cold plate, disposed in the tank and in thermal contact with at least one high power commodity of the electronic device; and
    a first pipe, disposed and extending between an exterior and an interior of the tank, the first pipe communicating with the condenser and the cold plate, and the first pipe being configured to receive a second fluid to flow through the condenser and the cold plate.

2. The immersion liquid cooling equipment according to claim 1, wherein the first pipe is configured to guide the second fluid to flow through the condenser first, and flow through the cold plate.

3. The immersion liquid cooling equipment according to claim 1, wherein a temperature of the second fluid is lower than a vaporization temperature of the first fluid, and the temperature of the second fluid is lower than an operating temperature of the high power commodity.

4. The immersion liquid cooling equipment according to claim 1, further comprising a multi-way valve, disposed at the first pipe and fluidly communicating between the condenser and the cold plate, and the second fluid flowing out of the condenser being controlled by the multi-way valve and flowing out of the tank or flowing into the cold plate.

5. The immersion liquid cooling equipment according to claim 4, further comprising a controller, configured to receive a monitoring signal from the electronic device, and the monitoring signal reflecting a heating state of the high power commodity, wherein the multi-way valve is a solenoid valve and is electrically connected to the controller so that the controller controls operation of the solenoid valve according to the monitoring signal,
    wherein when the heating state of the high power commodity does not reach a first preset value, the controller drives the solenoid valve so that the second fluid flowing out of the condenser flows out of the tank but does not flow through the cold plate,
    wherein when the high power commodity reaches a second preset value, the controller drives the solenoid valve so that the second fluid flowing out of the condenser all flows to the cold plate, and the second preset value is higher than the first preset value.

6. The immersion liquid cooling equipment according to claim 4, wherein the second fluid flowing out of the condenser is controlled by the multi-way valve and may further simultaneously flow out of the tank and flow into the cold plate.

7. The immersion liquid cooling equipment according to claim 6, further comprising a controller, configured to receive a monitoring signal from the electronic device, and the monitoring signal reflecting a heating state of the high power commodity, wherein the multi-way valve is a solenoid valve and is electrically connected to the controller so that the controller controls operation of the solenoid valve according to the monitoring signal,
    wherein when the high power commodity does not reach a first preset value, the controller drives the solenoid valve so that the second fluid flowing out of the condenser flows out of the tank but does not flow through the cold plate,
    wherein when the high power commodity reaches the first preset value but does not reach a second preset value, the controller drives the solenoid valve so that the second fluid flowing out of the condenser each flows out of the tank and flows through the cold plate,
    wherein when the high power commodity reaches the second preset value, the controller drives the solenoid valve so that the second fluid flowing out of the condenser all flows to the cold plate, and the first preset value is higher than the second preset value.

8. The immersion liquid cooling equipment according to claim 1, further comprising:
    a heat exchanger;
    a first multi-way valve;
    a second multi-way valve; and
    a second pipe, connected to the first pipe through the first multi-way valve and the second multi-way valve so that the first multi-way valve is located before the second fluid enters the condenser, and the second multi-way valve is located after the second fluid flows out of the condenser, and the heat exchanger being disposed in the second pipe and immersed in the first fluid in the form of a liquid,
    wherein the second fluid located in the first pipe is guided by the first multi-way valve and flows into the condenser or flows through the second pipe and the heat exchanger before joining the first pipe through the second multi-way valve,
    wherein the second fluid flowing out of the condenser is guided by the second multi-way valve and flows out of the tank or flows into the cold plate or simultaneously flows out of the tank and flows into the cold plate.

9. The immersion liquid cooling equipment according to claim 8, further comprising a controller, configured to receive a monitoring signal from the electronic device, and the monitoring signal reflecting a heating state of the high power commodity, wherein the first multi-way valve and the second multi-way valve are respectively solenoid valves, and are electrically connected to the controller so that the controller controls operation of the solenoid valve according to the monitoring signal,
    wherein when the electronic device is not started, the controller drives the first multi-way valve so that the second fluid in the first pipe flows to the second pipe but does not flow to the condenser, and the second fluid joins the first pipe through the second multi-way valve to flow out of the tank after flowing through the heat exchanger,
    wherein when the electronic device is started, the controller drives the first multi-way valve so that the second fluid flows to the condenser but does not flow to the second pipe and the heat exchanger.

10. The immersion liquid cooling equipment according to claim 9, wherein after the electronic device is started and when the high power commodity does not reach a first preset value, the controller drives the second multi-way valve so that the second fluid flows out of the tank but does not flow through the cold plate.

11. The immersion liquid cooling equipment according to claim 9, wherein after the electronic device is started and when the high power commodity reaches a first preset value but does not reach a second preset value, the controller drives the second multi-way valve so that the second fluid flows out the tank and flows through the cold plate, and the second preset value is higher than the first preset value.

12. The immersion liquid cooling equipment according to claim 9, wherein after the electronic device is started and when the high power commodity reaches a second preset value, the controller drives the second multi-way valve so that the second fluid all flows to the cold plate.

13. The immersion liquid cooling equipment according to claim 1, further comprising the electronic device.

14. A heat dissipation method for an electronic device, comprising:
provided a tank to accommodate a first fluid, and immersing the electronic device in the first fluid in the form of a liquid;
providing a cold plate to be in thermal contact with at least one high power commodity of the electronic device; and
providing a condenser and a first pipe, wherein the first pipe communicates with the condenser and the cold plate, and providing a second fluid to the first pipe to flow through the condenser and the cold plate, wherein the condenser is located above the first fluid in the form of a liquid, wherein the first fluid in the form of a liquid absorbs heat of the electronic device and is converted into the first fluid in the form of a gas, the second fluid flowing through the condenser drives the condenser to absorb heat of the first fluid in the form of a gas, and convert the first fluid in the form of a gas into the first fluid in the form of a liquid before flowing back into the tank,
wherein the second fluid flowing through the cold plate drives the cold plate to absorb heat of the high power commodity.

15. The heat dissipation method for the electronic device according to claim 14, further comprising using the first pipe to guide the second fluid to flow through the condenser first, and flow down through the cold plate.

16. The heat dissipation method for the electronic device according to claim 14, wherein a temperature of the second fluid is lower than a vaporization temperature of the first fluid, and the temperature of the second fluid is lower than an operating temperature of the high power commodity.

17. The heat dissipation method for the electronic device according to claim 14, further comprising:
providing a multi-way valve, disposed at the first pipe and connected between the condenser and the cold plate to control a flow direction of the second fluid flowing out of the condenser,
when a heating state of the high power commodity does not reach a first preset value, driving the multi-way valve so that the second fluid flowing out of the condenser flows out of the tank but does not flow through the cold plate,
when the heating state of the high power commodity reaches the first preset value but does not reach a second preset value, driving the multi-way valve so that the second fluid flowing out of the condenser each flows out of the tank and flows through the cold plate,
when the heating state of the high power commodity reaches the second preset value, driving the multi-way valve so that the second fluid flowing out of the condenser all flows to the cold plate,
wherein the second preset value is higher than the first preset value.

18. The heat dissipation method for the electronic device according to claim 14, further comprising:
providing a heat exchanger, a first multi-way valve, a second multi-way valve, and a second pipe, wherein the second pipe is connected to the first pipe through the first multi-way valve and the second multi-way valve, the first multi-way valve is located before the second fluid enters the condenser, the second multi-way valve is located after the second fluid flows out of the condenser, and the heat exchanger is disposed in the second pipe and immersed in the first fluid in the form of a liquid,
when the electronic device is not started, driving the first multi-way valve so that the second fluid in the first pipe flows to the second pipe but does not flow to the condenser, and the second fluid joins the first pipe through the second multi-way valve to flow out of the tank after flowing through the heat exchanger,
After the electronic device is started, driving the first multi-way valve so that the second fluid flows to the condenser but does not flow to the second pipe and the heat exchanger.

19. The heat dissipation method for the electronic device according to claim 18, after the electronic device is started and when the high power commodity does not reach a first preset value, driving the second multi-way valve so that the second fluid flows out of the tank but does not flow through the cold plate.

20. The heat dissipation method for the electronic device according to claim 18, after the electronic device is started and when the high power commodity reaches a first preset value but does not reach a second preset value, driving the second multi-way valve so that the second fluid flows out of the tank and flows through the cold plate, and the second preset value being higher than the first preset value.

21. The heat dissipation method for the electronic device according to claim 18, after the electronic device is started and when the high power commodity reaches a second preset value, driving the second multi-way valve so that the second fluid all flows to the cold plate.

* * * * *